US012768046B2

(12) United States Patent
Kobayashi et al.

(10) Patent No.: US 12,768,046 B2
(45) Date of Patent: Oct. 20, 2026

(54) SUBSTRATE SUPPORT, APPARATUS FOR PROCESSING SUBSTRATE, AND METHOD OF ADJUSTING TEMPERATURE OF SUBSTRATE

(71) Applicant: TOKYO ELECTRON LIMITED, Tokyo (JP)

(72) Inventors: Toshiki Kobayashi, Tokyo (JP); Einosuke Tsuda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 17/368,242

(22) Filed: Jul. 6, 2021

(65) Prior Publication Data

US 2022/0010428 A1 Jan. 13, 2022

(30) Foreign Application Priority Data

Jul. 10, 2020 (JP) ................................ 2020-119427

(51) Int. Cl.
*C23C 16/458* (2006.01)
*C23C 4/134* (2016.01)
*C23C 16/46* (2006.01)

(52) U.S. Cl.
CPC .......... *C23C 16/4586* (2013.01); *C23C 4/134* (2016.01); *C23C 16/463* (2013.01)

(58) Field of Classification Search
None
See application file for complete search history.

(56) References Cited

U.S. PATENT DOCUMENTS 7,771,564 B2 8/2010 Yokogawa et al.
9,640,404 B2 5/2017 Suzuki et al.
9,912,258 B2 3/2018 Park et al.
2008/0023147 A1 1/2008 Yokogawa et al.
2009/0118872 A1* 5/2009 Nonaka .............. G05D 23/1934 700/285
2010/0126666 A1* 5/2010 Tandou ............. H01L 21/67109 156/345.27

(Continued)

FOREIGN PATENT DOCUMENTS

JP 2006-286733 A 10/2006
JP 2008034408 A 2/2008

(Continued)

*Primary Examiner* — Jeffrie R Lund
*Assistant Examiner* — Tiffany Z Nuckols
(74) *Attorney, Agent, or Firm* — Fenwick & West LLP

(57) ABSTRACT

A substrate support is provided. The substrate support includes a main body of the substrate support that receives a heat input from at least an outside of the substrate support, a refrigerant passage provided in the main body and configured to take heat from the main body by a refrigerant, a switching mechanism that switches a position where the refrigerant is supplied to the refrigerant passage and a position where the refrigerant is discharged from the refrigerant passage between one end and the other end of the refrigerant passage in order to reverse a direction in which the refrigerant flows in the refrigerant passage, and a control unit. The control unit is configured to control the switching mechanism so as to repeatedly reverse the direction in which the refrigerant flows during a period in which the main body receives the heat input.

9 Claims, 11 Drawing Sheets

(56) References Cited

U.S. PATENT DOCUMENTS

| | | | | |
|---|---|---|---|---|
| 2012/0070914 | A1* | 3/2012 | Dhindsa | C23C 16/46 438/5 |
| 2013/0228323 | A1* | 9/2013 | Makabe | H01L 21/67109 165/59 |
| 2014/0008020 | A1* | 1/2014 | Nagayama | H01J 37/32724 137/2 |
| 2015/0129165 | A1* | 5/2015 | Parkhe | H01L 21/67109 165/67 |
| 2015/0376783 | A1 | 12/2015 | Hanamachi et al. | |
| 2016/0071755 | A1* | 3/2016 | Park | H02N 13/00 165/100 |
| 2016/0284553 | A1 | 9/2016 | Suzuki et al. | |
| 2019/0003052 | A1* | 1/2019 | Shero | C23C 16/52 |
| 2019/0371570 | A1* | 12/2019 | Oka | C23C 16/463 |
| 2019/0371634 | A1* | 12/2019 | Yamada | H01J 37/32522 |
| 2021/0351021 | A1* | 11/2021 | Silveira | H01J 37/32522 |

FOREIGN PATENT DOCUMENTS

| | | | |
|---|---|---|---|
| JP | 2014-022464 | A | 2/2014 |
| JP | 2015-231025 | A | 12/2015 |
| JP | 2016-186094 | A | 10/2016 |
| KR | 10-2007-0102918 | A | 10/2007 |
| KR | 10-2013-0019540 | A | 2/2013 |
| KR | 10-2016-0029213 | A | 3/2016 |
| TW | 201436095 | A | 9/2014 |

* cited by examiner

SUBSTRATE SUPPORT, APPARATUS FOR PROCESSING SUBSTRATE, AND METHOD OF ADJUSTING TEMPERATURE OF SUBSTRATE

CROSS-REFERENCE TO RELATED APPLICATION

This application claims priority to Japanese Patent Application No. 2020-119427, filed on Jul. 10, 2020, the entire contents of which are incorporated herein by reference.

TECHNICAL FIELD

The present disclosure relates to a substrate support, an apparatus for processing a substrate, and a method of adjusting a temperature of the substrate.

BACKGROUND

In a semiconductor manufacturing process, various processes such as film formation processing, etching processing, and the like are performed on a semiconductor wafer (hereinafter referred to as "wafer") which is a substrate, and these processes are performed in a state in which the temperature of the wafer is adjusted to a predetermined temperature.

When adjusting the temperature of the wafer, for example, a configuration in which the wafer is heated by using a heater provided in a substrate support on which a wafer to be processed is placed is known. The wafer processing is required to be uniform in the plane of the wafer.

Japanese Patent Application Publication No. 2006-286733 discloses a technique for performing temperature adjustment of a wafer placed on a substrate support using a refrigerant flowing through a plurality of refrigerant passages and simultaneously, performing temperature adjustment of the refrigerant using a chiller unit and a heating unit. In addition, these refrigerant passages are configured so that the refrigerant supplied from the chiller unit and the heating unit may be switched, and a configuration for controlling the temperature or temperature distribution of the substrate support in various ways or with high accuracy is described.

SUMMARY

The technique of the present disclosure provides a technique of uniformly adjusting the temperature of a substrate in the plane of the substrate.

In accordance with an aspect of the present disclosure, there is provided a substrate support. The substrate support a main body of the substrate support that a substrate is placed on and that receives a heat input from at least an outside of the substrate support; a refrigerant passage provided in the main body and configured to take heat from the main body by a refrigerant; a switching mechanism that switches a position where the refrigerant is supplied to the refrigerant passage and a position where the refrigerant is discharged from the refrigerant passage between one end and the other end of the refrigerant passage in order to reverse a direction in which the refrigerant flows in the refrigerant passage; and a control unit. The control unit is configured to control the switching mechanism so as to repeatedly reverse the direction in which the refrigerant flows during a period in which the main body receives the heat input.

BRIEF DESCRIPTION OF THE DRAWINGS

The objects and features of the present disclosure will become apparent from the following description of embodiments, given in conjunction with the accompanying drawings, in which.

DETAILED DESCRIPTION

First Embodiment

Figure 1:
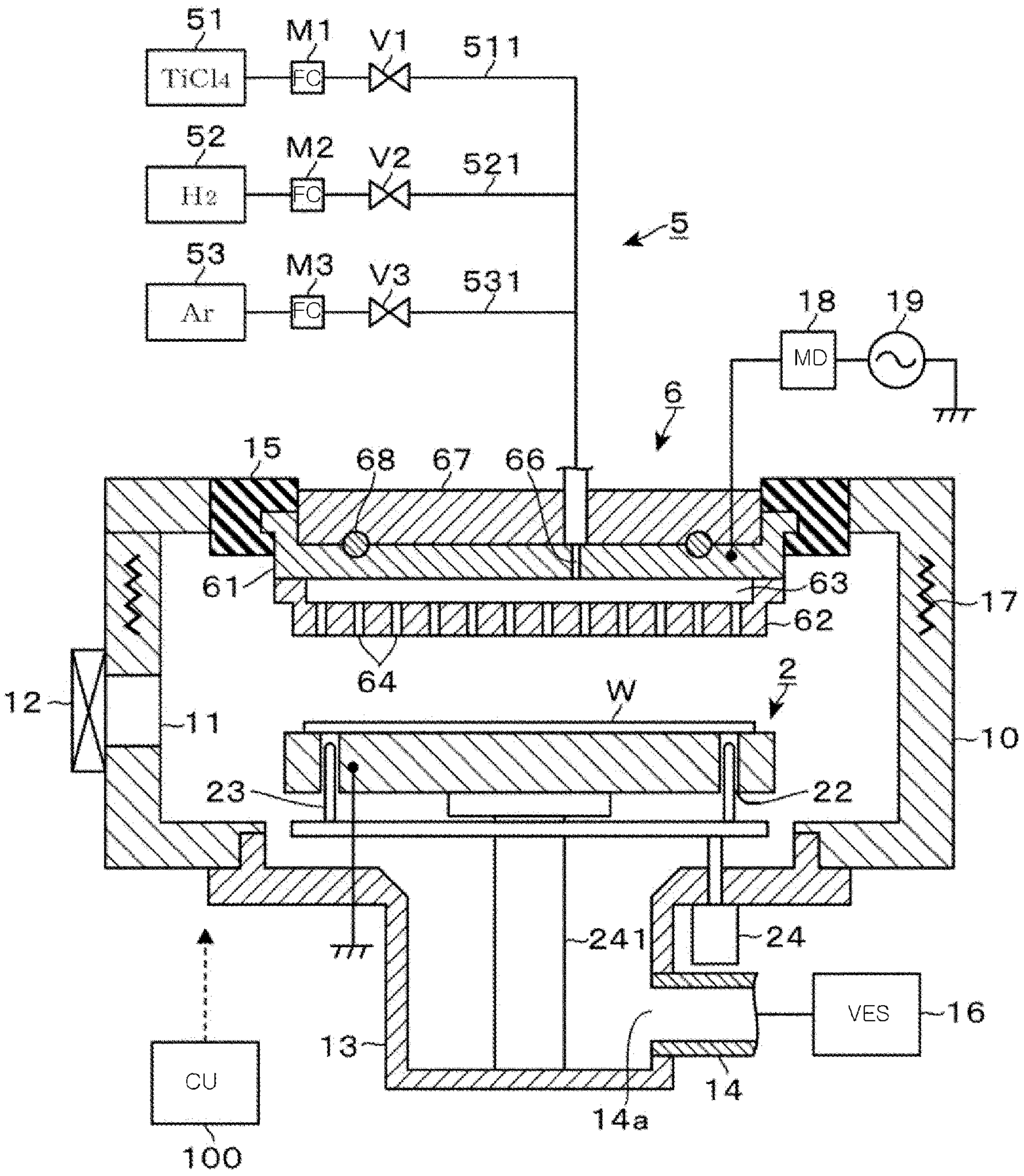
FIG. 1 is a vertical side view showing an example of a film forming apparatus according to the present disclosure.

A single-wafer film forming apparatus, which is an example of an apparatus for processing a substrate provided with a substrate support according to a first embodiment of the present disclosure, will be described with reference to FIG. 1. The film forming apparatus according to the present disclosure forms a titanium (Ti) film on a wafer W, which is a substrate, by plasma CVD. The film forming apparatus includes a processing chamber 10 that forms a processing space for processing the wafer W, and the processing chamber 10 is made of a metal such as aluminum (Al).

A loading/unloading opening 11 for loading/unloading the wafer W is formed in a side wall of the processing chamber 10 so as to be openable/closable by a gate valve 12.

In addition, an exhaust chamber 13 protruding downward, for example, having a cylindrical shape is formed in a center of a bottom wall of the processing chamber 10, an exhaust port 14*a* is opened in a side surface of the exhaust chamber 13, and an exhaust path 14 is connected to the exhaust port 14*a*. This exhaust path 14 is connected to a vacuum exhaust system (VES) 16 and is configured so that the inside of the processing chamber 10 may be depressurized to a predetermined pressure. Further, a heater 17 is embedded in a wall portion of the processing chamber 10, and is configured so that a wall surface of the processing chamber 10 may be heated to 150° C. to 200° C. Further, the heater 17 is provided with a power supply unit (not shown) that supplies a power to the heater, or an output adjusting unit (not shown) that adjusts a temperature of the wall surface of the processing chamber 10 by adjusting the power supplied to the heater 17 to adjust an output of the heater 17.

A shower head 6 for supplying a processing gas into the processing chamber 10 in the form of a shower via an insulating member 15 is provided on a ceiling portion of the processing chamber 10. The shower head 6 includes a base member 61 and a shower plate 62. The shower plate 62 is installed on a lower surface of the base member 61, and a gas diffusion space 63 in which the processing gas diffuses is formed between the shower plate 62 and the base member 61. A plurality of gas discharge holes 64 are formed in the shower plate 62, and a gas introduction hole 66 is formed near a center of the base member 61.

A gas supply system 5 for supplying the processing gas is connected to the gas introduction hole 66. The gas supply system 5 includes a $TiCl_4$ gas supply unit configured so as to supply $TiCl_4$ gas which is a Ti compound to the processing chamber 10. The $TiCl_4$ gas supply unit includes a $TiCl_4$ gas supply source 51 and a gas supply path 511, and a flow controller (FC) M1 and a valve V1 are installed from an upstream side in the gas supply path 511.

In addition, the gas supply system 5 includes an $H_2$ gas supply unit configured so as to supply hydrogen ($H_2$) gas which is a reducing gas and an Ar gas supply unit configured so as to supply argon (Ar) gas which is a gas for plasma formation.

The $H_2$ gas supply unit includes an $H_2$ gas supply source 52 and a gas supply path 521, and a flow controller (FC) M2 and a valve V2 are installed from an upstream side in the gas supply path 521. The Ar gas supply unit includes an Ar gas supply source 53 and a gas supply path 531, and, a flow controller (FC) M3 and a valve V3 are installed from an upstream side in the gas supply path 531. The $TiCl_4$ gas, $H_2$ gas, and Ar gas correspond to the processing gases.

In addition, an RF power supply source (high-frequency power source) 19 for plasma formation is connected to the shower head 6 via a matching device (MD) 18. Further, a heater 68 for heating the shower head 6 is provided on an upper surface of the base member 61, and a heat insulating member 67 is provided above the heater 68 and the base member 61. The heater 68 is provided with a power supply unit (not shown) that supplies power to the heater, or an output adjusting unit (not shown) that adjusts a temperature of the shower head 6 by adjusting an output of the heater 68. For example, the shower head 6 is heated to 400° C. to 450° C.

In the example, the shower head 6 and the gas supply system 5 correspond to a gas supply unit that supplies processing gases for processing the wafer W toward the wafer W placed on a substrate support 2.

The substrate support 2 including a substrate support main body 20, which will be described later, on which the wafer W is placed horizontally is provided inside the processing chamber 10. The substrate support 2 will be described with reference to FIGS. 2 to 4. Although described in detail later, heaters 41 and 42 are provided in the substrate support 2, and are configured so that the wafer W placed on the substrate support 2 is heated. Further, a power source (PS) 47 and a power source (PS) 48 capable of output adjustment are connected to the heaters 41 and 42 in order to adjust outputs of the heaters 41 and 42 to adjust a heating temperature of the wafer W. In this substrate support 2, a temperature measurement value obtained by measuring a temperature of the substrate support 2 with a temperature sensor (not shown) is compared with a temperature set value (for example, 300° C. to 360° C.), and the outputs of the heaters 41 and 42 are feedback-controlled so that the temperature of the substrate support 2 approaches the temperature set value.

However, in the film forming apparatus, for example, in order to suppress generation of by-products due to adsorption of the processing gas to the wall surface of the processing chamber 10, or in order to advance decomposition of the processing gas in the shower head 6, the wall surface of the processing chamber 10 or the shower head 6 may be heated. In the embodiment, the wall surface of the processing chamber 10 is heated to 170° C., and the shower head 6 is heated to 420° C. For this reason, a heat source may be provided outside the substrate support 2 such as the heater 17 of the processing chamber 10 or the heater 68 of the shower head 6 as described above. In this case, the substrate support 2 of the embodiment is in a state of receiving heat input from the outside. As a result, an amount of heat input increases due to the balance of heat input and output between these heat sources, and thus the temperature of the substrate support 2 may gradually increase.

Meanwhile, as described above, the outputs of the heaters 41 and 42 are controlled so that the temperature of the substrate support 2 approaches the temperature set value, and thus in order to suppress an increase in the temperature of the substrate support 2 due to the heat input from the outside, it is necessary to reduce the outputs of the heaters 41 and 42. However, when the set temperature at the time of performing processing of the wafer W is not sufficiently high, the outputs of the heaters 41 and 42 will reach a lower limit value, and thus there is a risk that the temperature of the wafer W may not be controlled.

In addition, for example, in a plasma processing apparatus that performs processing of the wafer W using a plasmatized processing gas, since energy from the plasma is also added when the plasma is excited, it may become more difficult to control the temperature of the substrate support 2 (wafer W) using the heaters 41 and 42. From this point of view, the heaters 41 and 42 themselves heating the substrate support 2 and the energy supplied from the plasmatized processing gas also serve as a heat source for supplying heat input to the substrate support 2.

Therefore, as described above, in the substrate support 2 in which the heat input from the outside is a problem, a refrigerant passage 31 may be provided for the substrate support 2 together with the heaters 41 and 42. A refrigerant flows through the refrigerant passage 31, and heat is taken from the substrate support 2 by heat exchange between the refrigerant and the substrate support 2 to discharge the heat to the outside, and accordingly, it is possible to secure a margin in terms of temperature for performing temperature control by increasing or decreasing the outputs of the heaters 41 and 42.

However, the refrigerant flowing through the refrigerant passage 31 absorbs heat from the substrate support 2 while the refrigerant flows through the refrigerant passage 31, and thus the temperature rises. Therefore, the temperature of the refrigerant increases at a discharge position compared to a supply position of the refrigerant passage 31. Accordingly, in the substrate support 2, an amount of heat lost to the refrigerant increases in a region close to the supply position of the refrigerant passage 31, but an amount of heat lost to the refrigerant decreases as it approaches the discharge position.

As a result, in the substrate support 2, when viewed along the refrigerant passage 31, it was found that a temperature difference occurs between the region close to the supply position of the refrigerant and the region close to the discharge position, and thus the temperature may become non-uniform in a plane of the substrate support 2.

Therefore, the substrate support 2 according to the present disclosure has a configuration capable of repeatedly reversing the direction in which the refrigerant flows in the refrigerant passage 31 in order to improve in-plane temperature uniformity of the substrate support 2.

Figure 2:
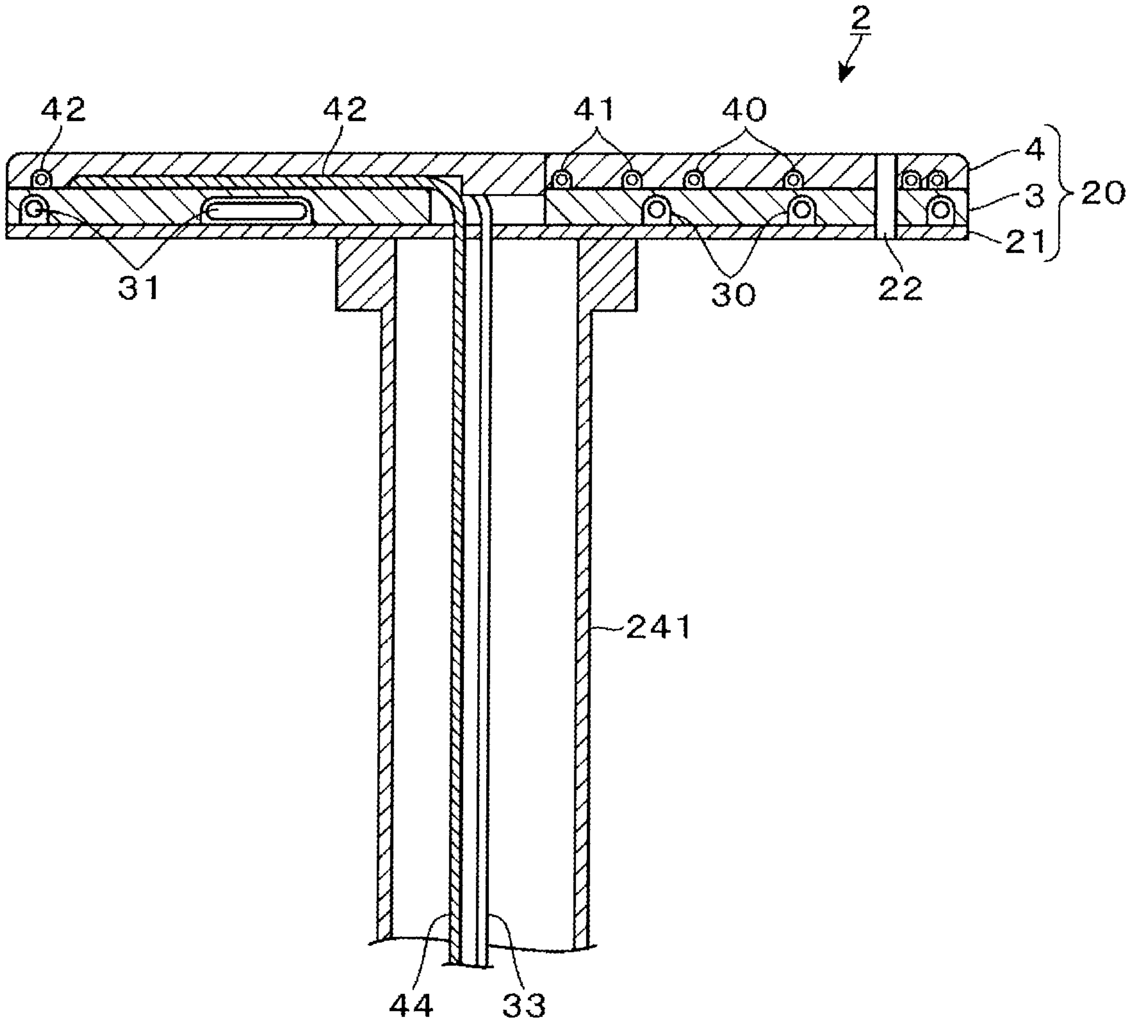
FIG. 2 is a vertical side view showing an example of a substrate support according to the present disclosure.

The configuration of the substrate support 2 will be described. As shown in FIG. 2, the substrate support 2 includes the substrate support main body 20 having a disk shape on which the wafer W is placed. The substrate support main body 20 has a structure in which a heating plate 4 having a supporting surface on which the wafer W is placed, a cooling plate 3, and a support plate 21 are stacked in this order from the upper side. For example, the heating plate 4, the cooling plate 3, and the support plate 21 are each made of nickel, and are bonded to each other by soldering.

Figure 3:
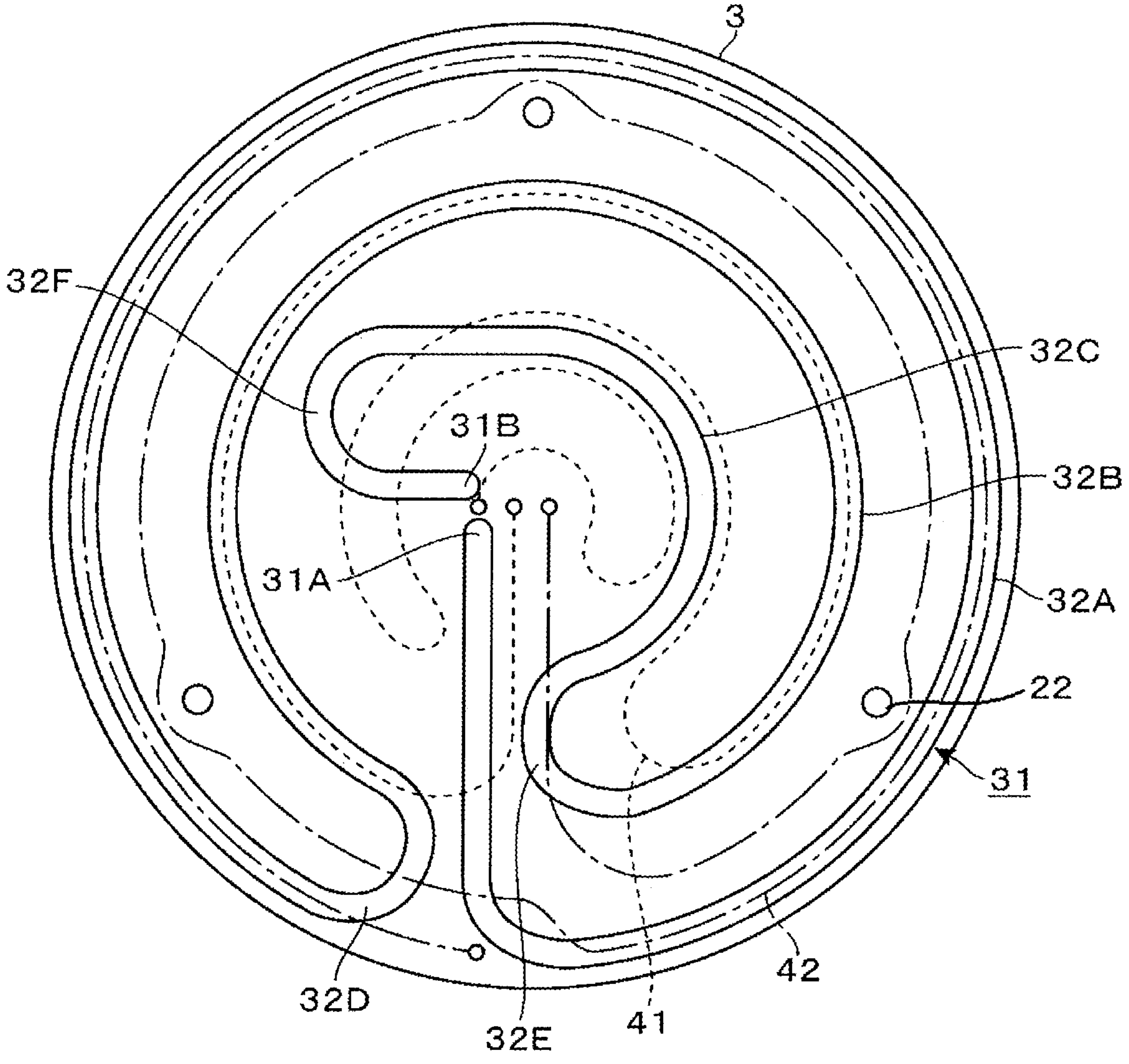
FIG. 3 is a plan view of a cooling plate provided on the substrate support.

As shown in FIGS. 2 and 3, the heating plate 4 has a groove portion 40 formed on a lower surface thereof, and the heaters 41 and 42 constituted by a heating wire generating heat by energization and configured to heat the substrate support main body 20 are provided in the groove portion 40.

As shown in FIG. 3, when viewing the substrate support main body 20 in a plan view, the heating plate 4 of the embodiment includes the heater 41 provided so as to surround the wafer W in a circumferential direction in a region near a central portion of the supporting surface of the wafer W and the heater 42 provided so as to surround the wafer W in the circumferential direction in a region near a peripheral portion of the supporting surface of the wafer W.

Figure 4:
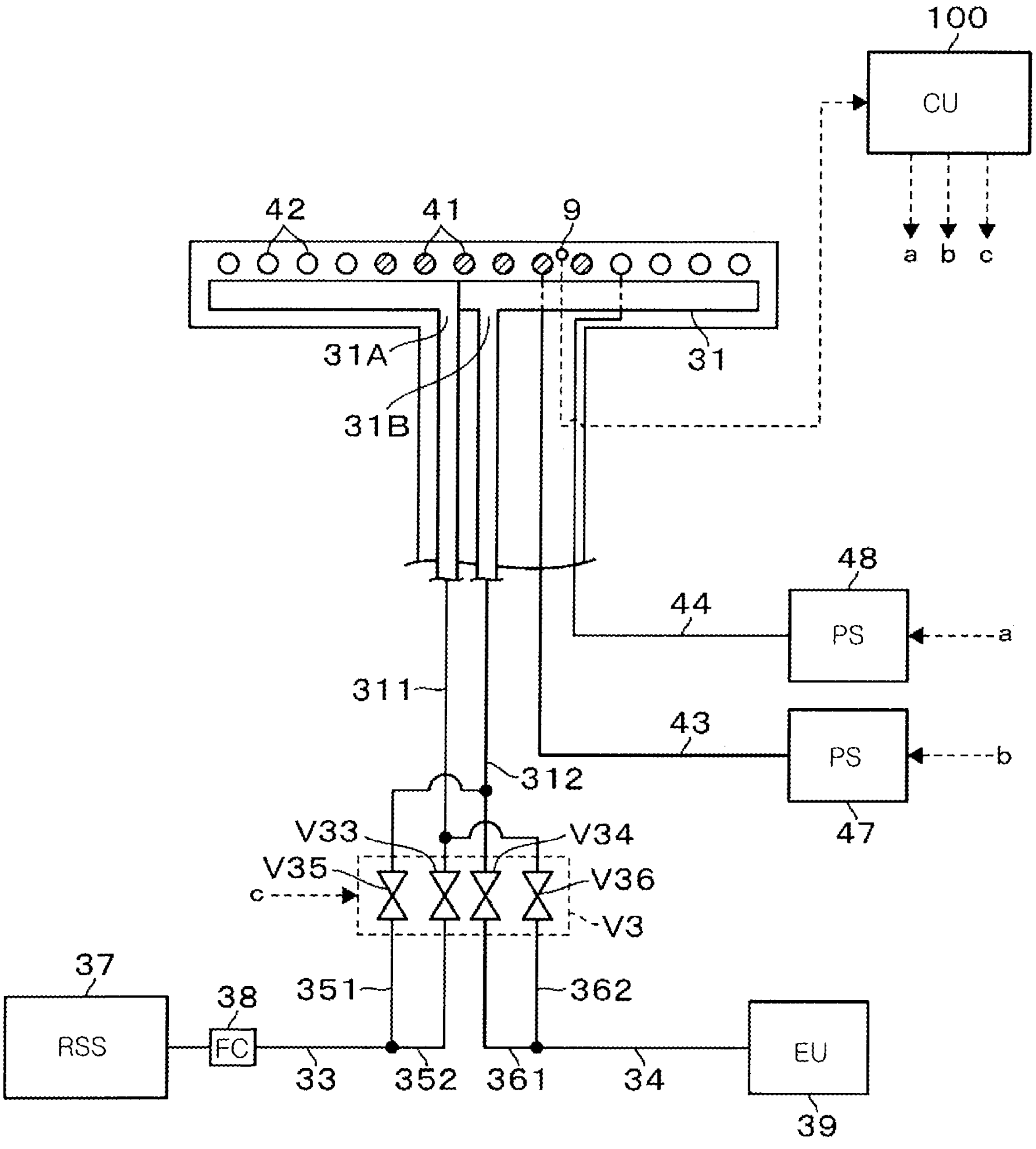
FIG. 4 is a block diagram showing an electrical configuration of the substrate support.

As shown in FIG. 4, the heaters 41 and 42 are connected to the power sources 47 and 48 via wirings 43 and 44, respectively. The power sources 47 and 48 have a configuration capable of adjusting the temperature of the substrate support main body 20 by adjusting the power supplied to the heaters 41 and 42. That is, the substrate support 2 of the present disclosure includes the plurality of heaters 41 and 42 that heat different regions of the substrate support main body 20 in a radial direction. Further, since output is independently adjusted and the heating temperature of the wafer W is adjusted, the power sources 47 and 48 capable of controlling the power supplied to the heaters 41 and 42 are provided. The power sources 47 and 48 configured to be able to adjust the power supplied to the heaters 41 and 42 correspond to the output adjusting unit of the embodiment.

Returning to FIGS. 2 and 3, the cooling plate 3 is provided with the refrigerant passage 31 through which the refrigerant that takes heat from the substrate support main body 20 flows. In the embodiment, in the substrate support main body 20, air, which is a gas, is used as the refrigerant under a temperature and pressure environment in the refrigerant passage 31 during a period in which the heat input is received from the heaters 41 and 42 for heating the substrate support main body 20, the heater 17 provided on the side of the processing chamber 10, and the like. The refrigerant passage 31 is constituted by one pipe of which both ends are open, and is disposed in a groove portion 30 formed on a lower surface side of the cooling plate 3. In the following description, an opening on one end side of the refrigerant passage 31 is referred to as a first end portion 31A, and an opening on the other end side is referred to as a second end portion 31B.

In the embodiment, the refrigerant passage 31 extends in a circumferential direction of the substrate support main body 20, and includes a plurality of circumferential passage portions 32A to 32C arranged at intervals from a central portion side of the supporting surface of the wafer W toward a peripheral portion side thereof. In addition, the circumferential passage portions 32A to 32C provided adjacent to each other are connected by connection passage portions 32D, 32E, and 32F extending along the radial direction of the supporting surface.

According to the above configuration, as shown in FIG. 3, the refrigerant passage 31 is provided over the entire surface of the region corresponding to the supporting surface while meandering between the first end portion 31A and the second end portion 31B described above.

In addition, as shown in FIG. 3, the heaters 41 and 42 and the refrigerant passage 31 are arranged above and below each other when the heating plate 4 and the cooling plate 3 are stacked, and are installed so as to include portions extending in parallel with each other. As such, heat of the heaters 41 and 42 is efficiently transferred to the refrigerant gas introduction hole passage 31 side by arranging the heaters 41 and 42 and the refrigerant passage 31 above and below each other, and accordingly, it is possible to prevent the refrigerant flowing through the refrigerant passage 31 from directly affecting the temperature distribution on a surface of the substrate support main body 20.

As shown in FIG. 4, a first system passage 311 is connected to the first end portion 31A, which is one end of the refrigerant passage 31, and a second system passage 312 is connected to the second end portion 31B, which is the other end of the refrigerant passage 31.

A refrigerant supply source (RSS) 37 for supplying air as a refrigerant is connected to the first system passage 311 and the second system passage 312 via a refrigerant supply path 33. Specifically, the first system passage 311 is connected to the refrigerant supply path 33 via a first connection passage 352, and the second system passage 312 is connected to the refrigerant supply path 33 via a second connection passage 351. Reference numeral 38 in FIG. 4 denotes a flow controller (FC) that adjusts a flow rate of the refrigerant supplied to the refrigerant passage 31.

In addition, an exhaust unit (EU) 39 for exhausting the refrigerant is connected to the first system passage 311 and the second system passage 312 via a refrigerant discharge path 34. Specifically, the first system passage 311 is connected to the refrigerant discharge path 34 via a third connection passage 362, and the second system passage 312 is connected to the refrigerant discharge path 34 via a fourth connection passage 361.

Valves V33 and V35 are provided for the first connection path 352 and the second connection path 351, respectively. In addition, valves V36 and V34 are provided for the third connection passage 362 and the fourth connection passage 361, respectively. The valves V33 to V36 constitute a valve mechanism V3 which is a switching mechanism of the example.

Figure 5:
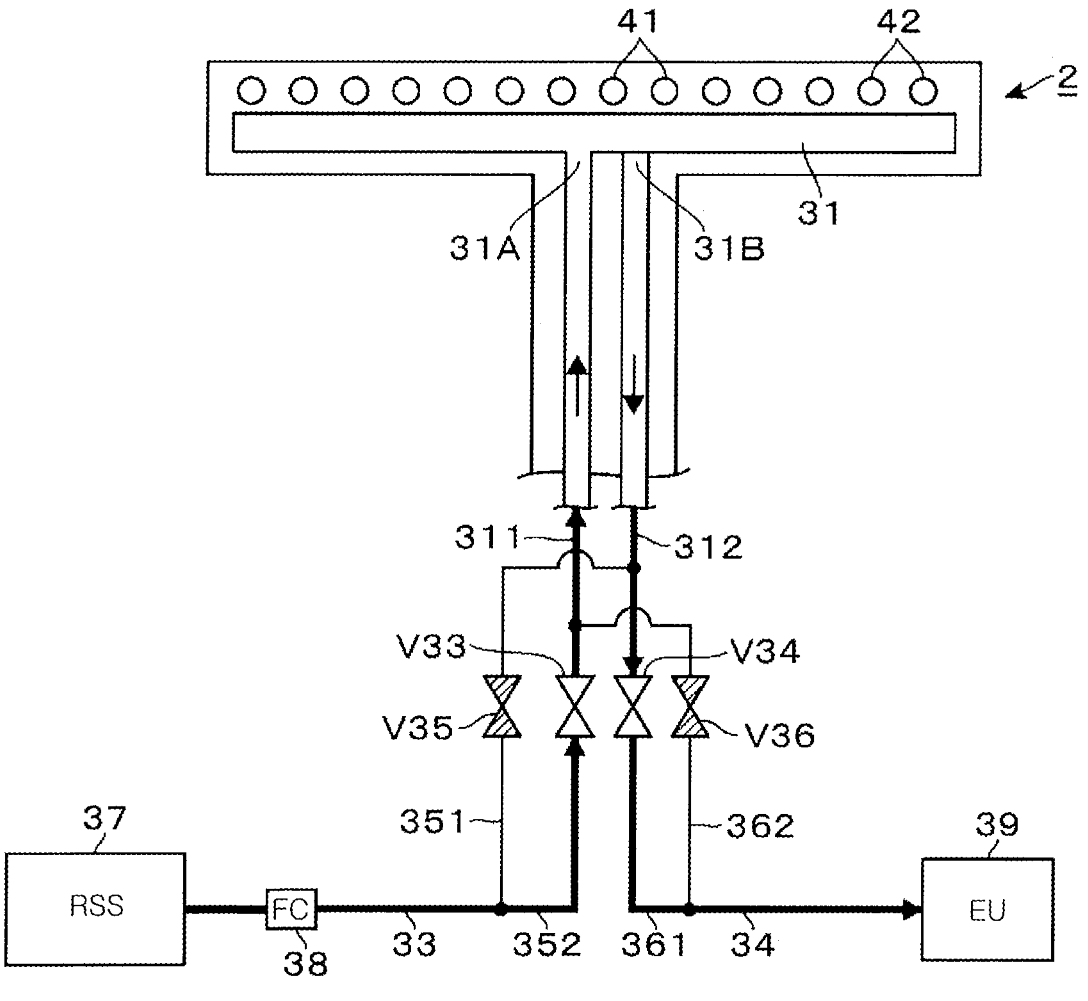
FIG. 5 is a first explanatory diagram for describing the switching of a flow direction of a refrigerant in a refrigerant passage.

In addition, as shown in FIG. 5, the refrigerant supplied from the refrigerant supply source 37 may be introduced from the first end portion 31A of the refrigerant passage 31 via the first system passage 311 by opening a set of the valves V33 and V34 and closing a set of the valves V35 and V36. The refrigerant flowing through the refrigerant passage 31 is discharged from the second end portion 31B, and is discharged to the refrigerant discharge path 34 via the second system passage 312.

Figure 6:
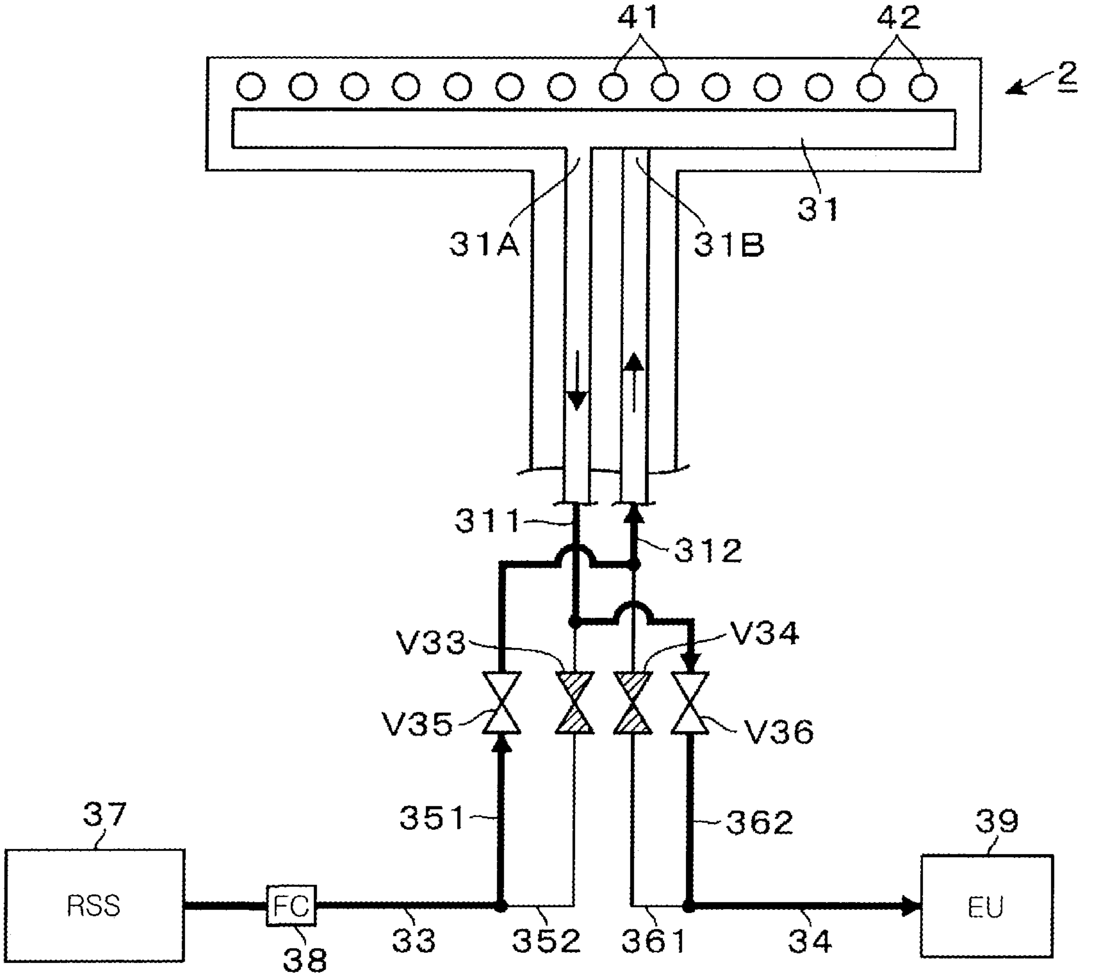
FIG. 6 is a second explanatory diagram for describing the switching of the flow direction of the refrigerant in the refrigerant passage.

In addition, as shown in FIG. 6, the refrigerant supplied from the refrigerant supply source 37 may be introduced from the second end portion 31B of the refrigerant passage 31 via the second system passage 312 by opening the set of the valves V35 and V36 and closing the set of the valves V33 and V34. The refrigerant flowing through the refrigerant passage 31 is discharged from the first end portion 31A, and is discharged to the refrigerant discharge path 34 through the first system passage 311.

As such, a position where the refrigerant is supplied to the refrigerant passage 31 and a position where the refrigerant is discharged from the refrigerant passage 31 may be switched between the first end portion 31A and the second end portion 31B by switching of opening and closing the sets of the valves V33 to V36. In accordance with this operation, a direction in which the refrigerant flows in the refrigerant passage 31 be reversed.

Returning to FIG. 1, the substrate support main body 20 is fixed to a bottom surface of the exhaust chamber 13 via a support column 241 made of a material having low thermal conductivity such as Hastelloy at a center of a lower surface thereof. Further, the substrate support main body 20 is provided with three hole portions 22 penetrating in a thickness direction at equal intervals in the circumferential direction, and a lifting pin 23 is disposed in each of the hole portions 22. The lifting pin 23 is lifted by a lifting mechanism 24 and is configured to protrude from the surface of the substrate support main body 20.

In addition, the substrate support main body 20 is grounded. Then, the processing gases including the excitation target gas (Ar gas), $TiCl_4$ gas, and $H_2$ gas are supplied into the processing chamber 10 from the shower head 6 described above. In addition, plasma of the processing gases is generated at an upper region of the substrate support main body 20 constituting a lower electrode by capacitive coupling by applying RF power to the shower head 6 constituting an upper electrode. The shower head 6, the RF power supply 19 applying RF power to the shower head 6, and the substrate support main body 20 constitute a plasma forming unit of the embodiment.

The film forming apparatus is provided with a control unit (CU) 100. The control unit 100 is connected to the gas supply system 5 and the vacuum exhaust system 16, and performs a Ti film forming process on the wafer W according to a recipe for performing a film forming process described later. In addition, as shown in FIG. 4, the control unit 100 is configured to output a control signal for adjusting the power input to the heaters 41 and 42 from the power sources 47 and 48 and operating the valve mechanism V3.

In addition, as shown in FIG. 4, a temperature measuring unit 9 for detecting the temperature of the substrate support main body 20 is provided in the substrate support main body 20, and the control unit 100 is configured so that the temperature measurement value measured by the temperature measuring unit 9 is input thereto. Then, the control unit 100 compares the temperature measurement value of the temperature measuring unit 9 with a set temperature of the substrate support main body 20, for example, a set value corresponding to a process temperature in the film forming process, and feedback control for increasing and decreasing the outputs of the heaters 41 and 42 is performed so that the temperature measurement value approaches the temperature set value.

In addition, the control unit 100 operates the valve mechanism V3, and switches on/off the flow of the refrigerant in the refrigerant passage 31. In this embodiment, when the valves V33 and V35 of the refrigerant supply path 33 side are closed, the flow of the refrigerant is stopped (OFF state), and the refrigerant flows through the refrigerant passage 31 (ON state) by opening one of the set of the valves V33 and V34 and the set of the valves V35 and V36. In addition, in order to avoid the passage from becoming sealed in a heating atmosphere, the valves V36 and V34 of the refrigerant discharge path 34 side may be open in the off state. Further, the control unit 100 switches a flow direction of the refrigerant by switching the set that performs opening and closing of the set of the valves V33 and V34, and the set of the valves V35 and V36. That is, the control unit 100 may reverse the flow direction of the refrigerant in the refrigerant passage 31 by operating the valve mechanism V3.

Figure 7:
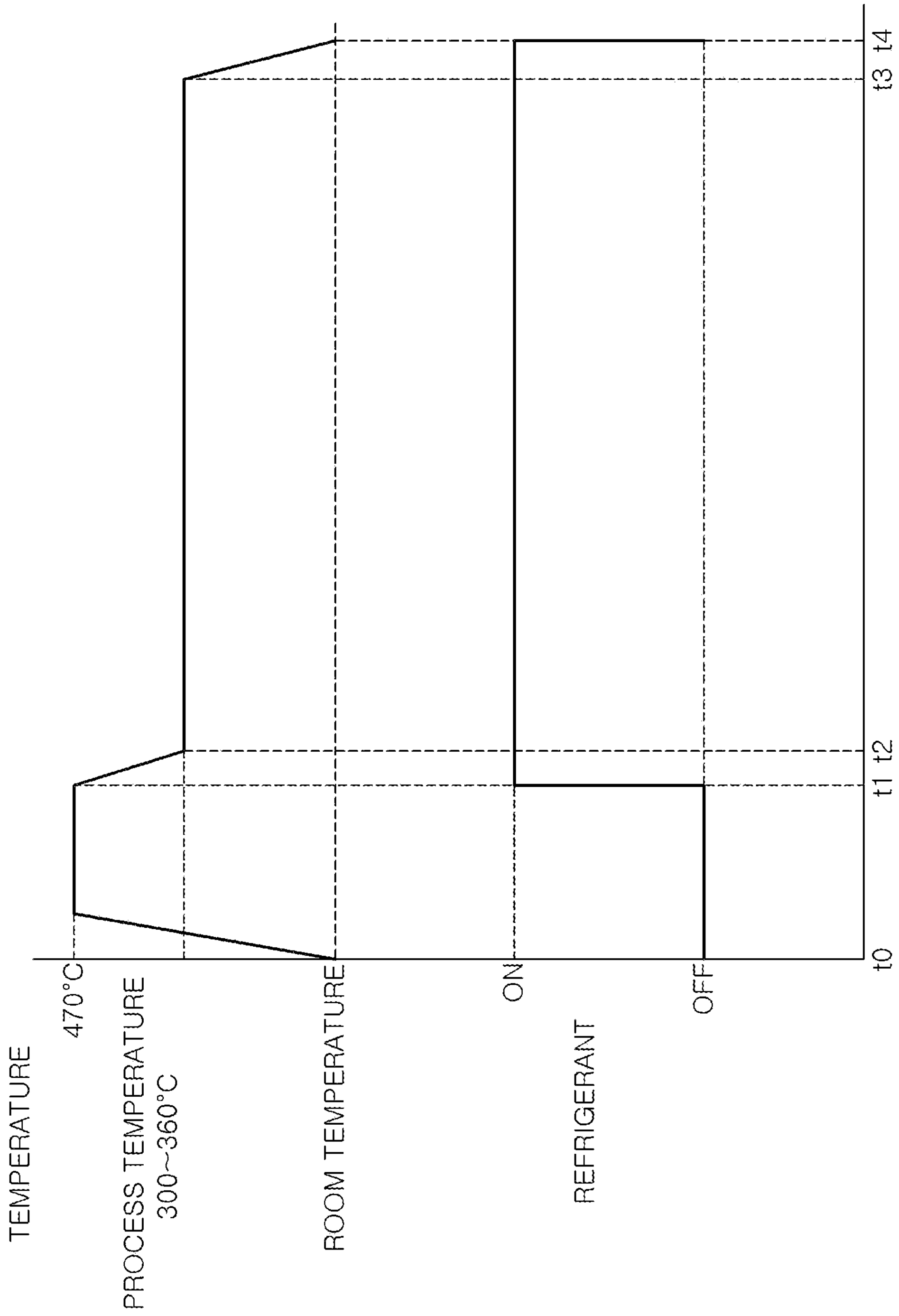
FIG. 7 is a time chart showing an example of heating of a heater and a flow of a refrigerant.

Subsequently, the operation of the film forming apparatus according to the present disclosure will be described with reference to a time chart of FIG. 7. A temperature of the substrate support main body 2 is shown at an upper end of the vertical axis of FIG. 7. Further, at a lower end of the vertical axis in FIG. 7, a state in which one of the set of the valves V33 and V34 and the set of the valves V35 and V36 is opened, and the refrigerant is being supplied is shown as ON, and a state in which all valves V33 to V36 are closed is shown as OFF.

First, before transferring the wafer W into the processing chamber 10, a precoating process for forming the Ti film on the wall surface of the processing chamber 10 is performed. The wall surface of the processing chamber 10 is heated to 150° C. to 200° C. by the heater 17 until a time t0 and simultaneously, the shower head 6 is heated to 400° C. to 450° C. by the heater 68.

Meanwhile, in the substrate support 2, the valves V33 and V35 are closed, the set temperature is set to, for example, 470° C. without flowing the refrigerant, and heating is performed by the heaters 41 and 42. Then, $TiCl_4$ gas, $H_2$ gas, and Ar gas are supplied from the shower head 6. Further, RF power is applied to the shower head 6 to excite Ar plasma. Accordingly, the $TiCl_4$ gas and $H_2$ gas react to form the Ti film in the processing chamber 10. In addition, when the refrigerant flows through the refrigerant passage 31 during precoating, an amount and heat capacity of the refrigerant increase, and the outputs of the heaters 41 and 42 until the target temperature is reached increase due to the cooling effect, and thus it takes time to raise the temperature. Therefore, it is preferable not to let the refrigerant flow through the refrigerant passage 31 during precoating.

Next, at a time t1, the set temperature of the substrate support main body 20 is changed to a set temperature in a range of 300° C. to 360° C. in the film forming process. In addition, as shown in FIG. 5, in the state in which the valves V35 and V36 are closed, the valves V33 and V34 are opened, for example, for 3 seconds. Accordingly, the refrigerant flows in the refrigerant passage 31 from the first end portion 31A side toward the second end portion 31B side for 3 seconds. Then, as shown in FIG. 6, the valves V33 and V34 are closed, and the valves V35 and V36 are switched so as to open, for example, for 12 seconds. Accordingly, the flow of the refrigerant in the refrigerant passage 31 is reversed, and the refrigerant flows in the refrigerant passage 31 from the second end portion 31B side toward the first end portion 31A side for 12 seconds.

Then, the substrate support main body 20 is heated while repeating a state in which the refrigerant flows in a direction shown in FIG. 5 (3 seconds in this example) and a state in which the refrigerant flows in a direction shown in FIG. 6 (12 seconds in this example).

As such, when viewed as a time average, a difference in an amount of heat lost to the refrigerant from the substrate support main body 20 between a region close to the first end portion 31A and a region close to the second end portion 31B of the refrigerant passage 31 becomes small by switching the direction in which the refrigerant flows. As such, by flowing the refrigerant maintained so that cooling capacity is more uniform in a longitudinal direction of the refrigerant passage 31, a margin for performing the temperature control over a region where the heaters 41 and 42 are disposed may be obtained uniformly. As a result, as shown in Examples to be described later, the temperature controllability by the heaters 41 and 42 is improved, and thus the in-plane temperature uniformity of the substrate support main body 20 is improved.

Then, while continuing the switching of the flow direction of the refrigerant described above, when the temperature of the substrate support main body 20 is stabilized at the set temperature in the range of 300° C. to 360° C., the wafer W is transferred above the substrate support main body 20 by an external transfer device at a time t2. Thereafter, the wafer W is received by the lifting pins 23 pushed up from a lower surface side, a transfer mechanism is retracted to the outside of the apparatus, and at the same time, the lifting pins 23 are lowered. Accordingly, the wafer W is placed on the substrate support main body 20, and is heated to the process temperature in the range of 300° C. to 360° C. At this time, since the substrate support main body 20 is heated so that the temperature in the plane is uniform by adjusting the outputs of the heaters 41 and 42 under refrigerant flow, uniform heating in the plane is also realized in the wafer W.

Thereafter, the processing gases are supplied to the wafer W to perform the film forming process. As the processing gases, $TiCl_4$ gas which is a film forming raw material, $H_2$ gas which is a reducing gas, and Ar gas which is a plasma formation gas are supplied from the shower head 6. In addition, when the RF power is applied to the shower head 6, the processing gases supplied into the processing chamber 10 are plasmatized, and the $TiCl_4$ and $H_2$ gases react to form a Ti film.

Meanwhile, when processing gas plasma is formed as described above, the heat input to the substrate support main body 20 increases, but the temperature rise of the substrate support main body 20 due to the heat input is detected by the temperature measuring unit 9, and output adjustment of the heaters 41 and 42 is performed by the control unit 100. At this time, by allowing the refrigerant to flow through the refrigerant passage 31 to take heat from the substrate support main body 20, the heaters 41 and 42 operate in a state in which a margin is secured with respect to the lower limit of the output, and thus the output may be lowered in response to heat input from the plasma. As such, it is possible to prevent the temperature adjustment of the substrate support main body 20 from becoming difficult even during a period during which the processing of the wafer W using plasma is being performed.

In addition, for example, in the film forming apparatus, maintenance of the film forming apparatus may be performed for every operation for a predetermined time or for every case of processing a predetermined number of wafers W. Such maintenance may be performed, for example, by opening the processing chamber 10, and thus it is necessary to lower the temperature of the substrate support main body 20 before opening. For example, in the embodiment shown in FIG. 7, after the wafer W in the processing chamber 10 is unloaded at a time t3, the heater 17 of the processing chamber, the heater 68 of the shower head 6, and the heaters 41 and 42 of the substrate support main body 20 are turned off, respectively, while the refrigerant supply to the refrigerant passage 31 continues.

As described above, even after the respective heaters 17, 41, and 42 are turned off, the substrate support main body 20 may be cooled quickly by continuing to flow the refrigerant through the refrigerant passage 31. Here, when cooling the substrate support main body 20, the direction in which the refrigerant flows may be switched, or, a state in which the refrigerant flows in a constant direction may be maintained without performing the switching. Thereafter, when the temperatures of the processing chamber 10, the shower head 6, and the substrate support main body 20 are sufficiently lowered, the supply of the refrigerant is stopped at a time t4 to perform maintenance of the film forming apparatus.

According to the above-described embodiment, in the substrate support 2 for adjusting the temperature of the wafer W, the refrigerant passage 31 through which the refrigerant that takes heat from the substrate support main body 20 flows is provided together with the heaters 41 and 42 for heating the substrate support main body 20. In addition, when the refrigerant flows through the refrigerant passage 31, the direction in which the refrigerant flows in the refrigerant passage 31 is reversed. Accordingly, the amount of heat taken from the substrate support main body 20 by the refrigerant flowing through the refrigerant passage 31 may be made uniform in a plane, and thus the in-plane temperature uniformity of the supporting surface of the wafer W may be improved.

This also applies to the plasma processing apparatus in which the amount of heat input to the substrate support main body 20 is temporarily increased when the plasma is formed.

In addition, for example, in a process with a relatively low process temperature of 400° C. or less, when performing temperature adjustment by reducing the outputs of the heaters 41 and 42, if heat is not taken from the substrate support main body 20, the temperature control may be difficult. Meanwhile, when the refrigerant flowing in the refrigerant passage 31 in a predetermined direction is used, as described above, there was a problem that the temperature of the substrate support main body 20 became non-uniform in a plane due to the temperature difference between the region close to the supply position of the refrigerant and the region close to the discharge position. The substrate support 2 according to the present disclosure suppresses the occurrence of this problem by repeatedly reversing the flow direction of the refrigerant flowing in the refrigerant passage 31.

In addition, when the process temperature is lower, even when the heaters 41 and 42 are not provided, the temperature adjustment of the wafer W may be necessary in order to suppress the influence of heat input from the heater 17 of the processing chamber, the heater 68 of the shower head 6, or the plasmatized processing gases. Even in such a case, the in-plane temperature uniformity of the supporting surface of the wafer W may be improved by repeatedly reversing the flow direction of the refrigerant flowing in the refrigerant passage 31. Further, for example, a heat source for inputting heat to the substrate support main body 20 may have a configuration provided for irradiating light to the substrate support main body 20 and heating the substrate support main body 20. At this time, the heat source may be configured to irradiate light to different regions of the substrate support main body 20 to raise the temperature of each region.

Here, a liquid, for example, water, may be used as the refrigerant under a temperature and pressure environment in the refrigerant passage 31 during the period during which the substrate support main body 20 is heated. Even when the liquid is used as the refrigerant, the in-plane temperature uniformity of the substrate support main body 20 may be improved. In addition, the refrigerant is not limited to a liquid or gas, and a fluid in a supercritical state under the temperature and pressure environment in the refrigerant passage 31 may be used.

Meanwhile, since gas has a lower heat exchange efficiency than liquid, the gas has a property that an amount of heat taken by the refrigerant per unit area is not too large. Therefore, when the refrigerant flows through the refrigerant passage 31, the substrate support main body 20 is excessively cooled, and thus even though the outputs of the heaters 41 and 42 are increased, it is possible to suppress the occurrence of a situation in which the temperature of the substrate support main body 20 becomes difficult to increase.

In addition, the substrate support main body 20 shown in the above-described embodiment includes a heater 41 for heating a central portion side of the substrate support main body 20 and a heater 42 for heating the peripheral side of the substrate support main body 20, and is provided so that the output of each of the heaters 41 and 42 may be adjusted independently. Therefore, the in-plane temperature uniformity of the substrate support main body 20 may be further improved by independently adjusting the output of each of the heaters 41 and 42.

As shown in Examples to be described later, the in-plane temperature uniformity of the substrate support main body 20 may be further improved by increasing the output of the heater 41 on the central portion side of the supporting surface, for example, which is a region where the temperature is relatively easy to decrease.

Second Embodiment

Figure 8:
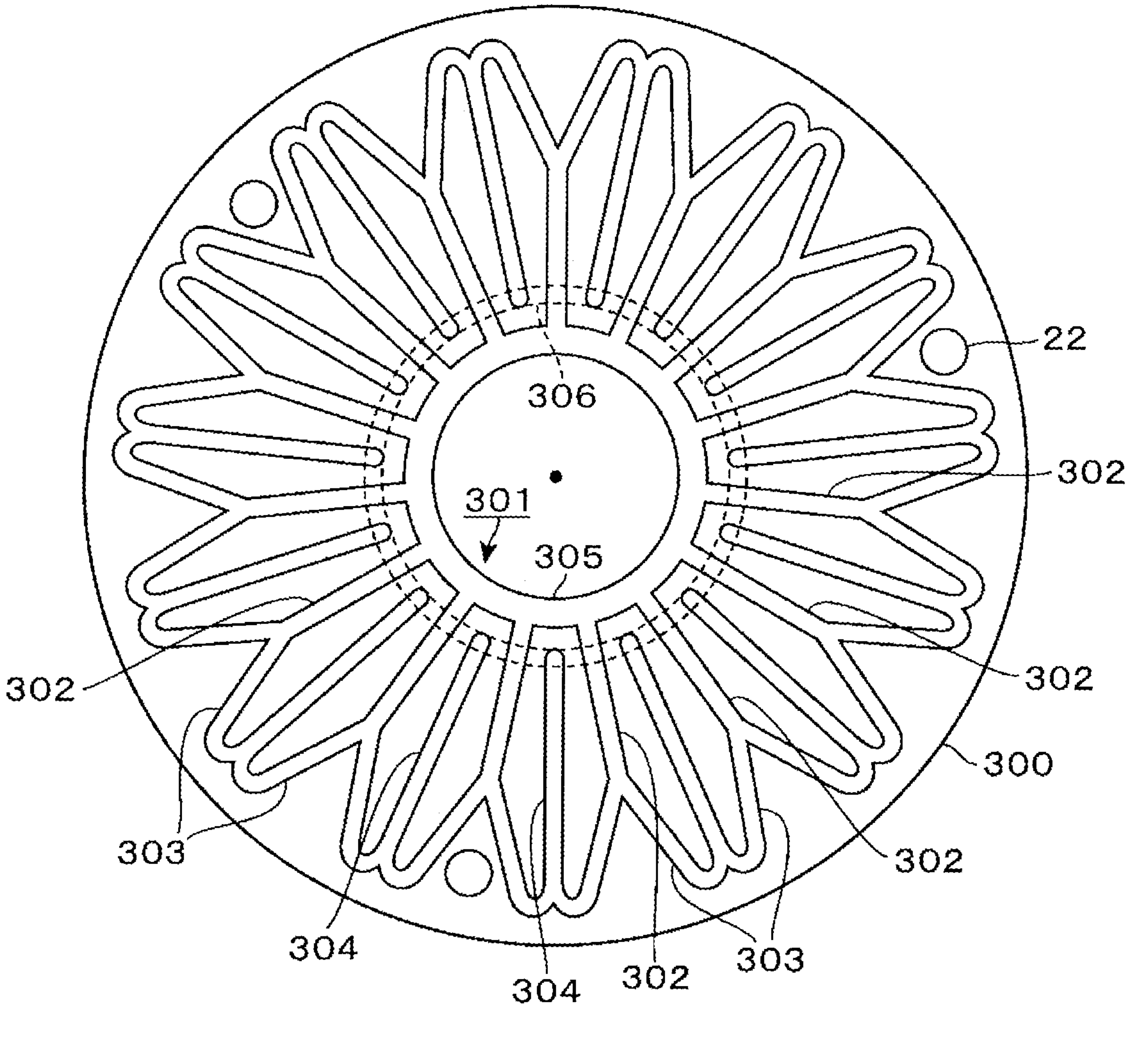
FIG. 8 is a plan view showing an example of a refrigerant passage according to a second embodiment.

Subsequently, a substrate support main body 20 according to a second embodiment will be described. FIG. 8 is a plan view of a lower surface side of a cooling plate 300 provided in the substrate support main body 20 according to the second embodiment. The cooling plate 300 has a groove portion that becomes a refrigerant passage 301 on the lower surface thereof. For example, the refrigerant passage 301 is provided with an annular groove portion 305 on a central portion side of the cooling plate 300 so as to surround the central portion. A plurality of radial groove portions 302, which are a plurality of radial passages extending radially when viewed from a central portion of the substrate support main body 20, are connected to the annular groove portion 305 at equal intervals in a circumferential direction.

Each of the radial groove portions 302 is branched left and right in a region of a peripheral side of the cooling plate 300 (a branch path 303). The branch path 303 constitutes a merging groove portion 304 in which the extension direction is folded back toward the central portion of the cooling plate 300 after two branch paths 303 branching from the radial groove portions 302 arranged adjacent to each other on the left and right are merged, respectively.

By installing a support plate 21 on the lower surface side of the cooling plate 300, a lower surface of the groove portion is blocked, and the refrigerant passage 301 is formed. In this embodiment, for example, a first end portion 31A is formed so as to be opened in the annular groove portion 305, and a first system passage 311 is connected thereto. Meanwhile, in each merging groove portion 304, an annular passage 306 including a communication hole opened toward an end portion of the merging groove portion 304 is provided at an end portion on the central portion side of the cooling plate 300, for example, on the support plate 21 side, and a second end portion 31B is formed so as to be opened in the annular passage 306. A second system passage 312 is connected to the second end portion 31B.

As shown in FIG. 8, the refrigerant passage 301 is rotationally symmetrically formed around the central portion of the cooling plate 300 having a disk shape (substrate support main body 20).

Even in the substrate support main body 20 provided with the cooling plate 300 as described above, the in-plane temperature uniformity of the substrate support main body 20 may be improved by repeatedly reversing the flow direction of the refrigerant.

In addition, in an example shown in FIG. 8, since the refrigerant passage 301 is formed only by forming the groove portion in the cooling plate 300, processing is easier compared to a configuration in which a pipe serving as the refrigerant passage 31 is provided, and the formation of the refrigerant passage 301 having a complicated shape is also easy. Further, the refrigerant passage 301 is rotationally symmetrically formed around the central portion of the supporting surface of the wafer W in the substrate support main body 20, and accordingly, the effect of improving the in-plane temperature uniformity of the substrate support main body 20 is further enhanced.

Third Embodiment

Figure 9:
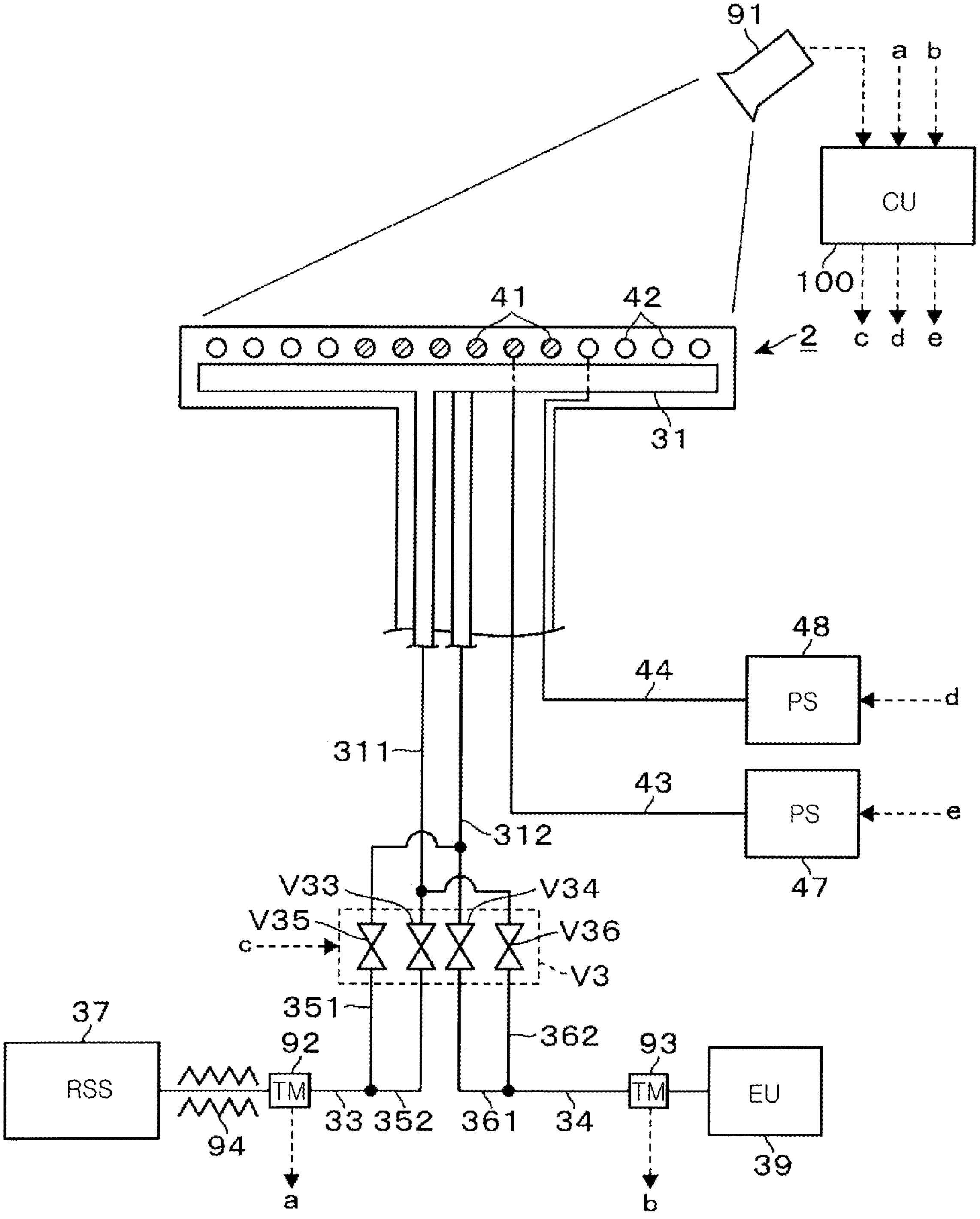
FIG. 9 is a block diagram showing an electrical configuration of a substrate support according to a third embodiment.

Next, a substrate support main body 20 according to a third embodiment will be described with reference to FIG. 9. The substrate support main body 20 is provided with a temperature measuring unit 91 for measuring temperatures of a plurality of different positions on the supporting surface of the substrate support main body 20 or a plurality of different positions on the wafer W. In an example shown in FIG. 8, an example in which the temperature measuring unit 91 is, for example, constituted by a thermographic device capable of measuring a temperature of a region heated by the heater 41 near the central portion of the substrate support main body 20 and a temperature of a region heated by the heater 42 from the peripheral portion is shown. In addition, instead of this example, the temperature measuring unit 91 composed of a thermocouple may be provided at a plurality of positions in the substrate support main body 20.

In addition, the temperature of the plurality of different positions is measured, and based on the results, by adjusting at least one of the timing for repeatedly reversing the flow direction of the refrigerant, the temperature of the substrate support main body 20 heated using the heaters 41 and 42, and the flow rate of the refrigerant, the temperature distribution in a plane of the substrate support main body 20 is adjusted so as to control the temperature difference at the plurality of different positions to be reduced.

For example, by increasing the flow rate of the refrigerant, the amount of heat taken from the substrate support main body 20 may be increased, so that the temperature of the substrate support main body 20 may be lowered. In addition, when adjusting the timing for repeatedly switching the flow direction of the refrigerant, the amount of heat taken from the region close to the first end portion 31A (in the example shown in FIG. 3, the peripheral portion side of the substrate support main body 20) may be increased by lengthening the time in the flow direction with the first end portion 31A as the refrigerant supply position. On the other hand, the amount of heat taken from the region close to the second end portion 31B (in the example shown in FIG. 3, the central portion side of the substrate support main body) may be increased by lengthening the time in the flow direction with the second end portion 31B as the refrigerant supply position. As such, since the distribution of the amount of heat taken from the substrate support main body 20 may be adjusted by adjusting the period for reversing the flow direction of the refrigerant, this contributes to the control of in-plane temperature distribution of the substrate support main body 20.

In addition, outputs of the heater 41 for heating the central portion side of the substrate support main body 20 and the heater 42 for heating the peripheral side of the substrate support main body 20 may be adjusted, respectively. Alternatively, as shown in FIG. 9, a heater 94 for adjusting a temperature of the refrigerant may be provided in the refrigerant passage 31 to adjust a temperature of the refrigerant supplied to the refrigerant passage 31.

In addition, a temperature measuring unit (TM) 92 and a temperature measuring unit (TM) 93 that measure the temperature of the supplied refrigerant and the temperature of the discharged refrigerant, respectively, may be provided. An amount of heat dissipation may be calculated from a temperature difference between the temperature of the supplied refrigerant and the temperature of the discharged refrigerant. Further, the amount of heat dissipation may be controlled so as to approach a preset value by adjusting at least one of the timing for repeatedly switching the flow direction of the refrigerant, the temperature of the substrate support main body 20 due to the heating, and the flow rate of the refrigerant based on the amount of heat dissipation.

Further, a plurality of refrigerant passages 31 and 301 may be provided in the substrate support main body 20, and for example, a switching mechanism such as a valve mechanism V3 may be provided in each of the plurality of refrigerant passages 31 and 301. In the plurality of refrigerant passages 31 and 301, the direction in which the refrigerant flows independently of each other may be switched by the above configuration. According to this method, the in-plane temperature distribution of the substrate support main body 20 may be more finely adjusted.

It should be considered that the embodiments disclosed at this time are illustrative in all respects and not restrictive. The embodiment may be omitted, substituted, or changed in various forms, without departing from the scope of the appended claims and the gist thereof.

EXAMPLE

Experiment 1

The following experiments were conducted in order to verify the effect of the substrate support 2 according to the present disclosure. First, using the film forming apparatus shown in the first embodiment, a set temperature of the substrate support main body 2 was set to 300° C. When the refrigerant flows through the refrigerant passage 31, a period in which the first end portion 31A is set to the supply position of the refrigerant was 3 seconds, and then a period in which the second end portion 31B is set to the supply position of the refrigerant was 12 seconds, and an example of repeated execution was designated as Example 1. Further, the heater 17 of the processing chamber 10 and the heater 68 of the shower head 6 are turned off in Example 1.

In addition, in addition to Example 1, an example in which the wall portion of the processing chamber 10 was heated to 170° C. was designated as Example 2.

Further, as compared with a state of Example 2, an example in which the output of the heater 41 on the central portion side was increased so that the temperature of the central portion side of the substrate support main body 20 increased by 5° C. was designated as Example 3.

In addition, when the refrigerant flows through the refrigerant passage 31, an example in which the first end portion 31A is fixed as the refrigerant supply position was designated as Comparative Example 1, and an example in which the second end portion 31B is fixed as the refrigerant supply position was designated as Comparative Example 2.

Figure 10:
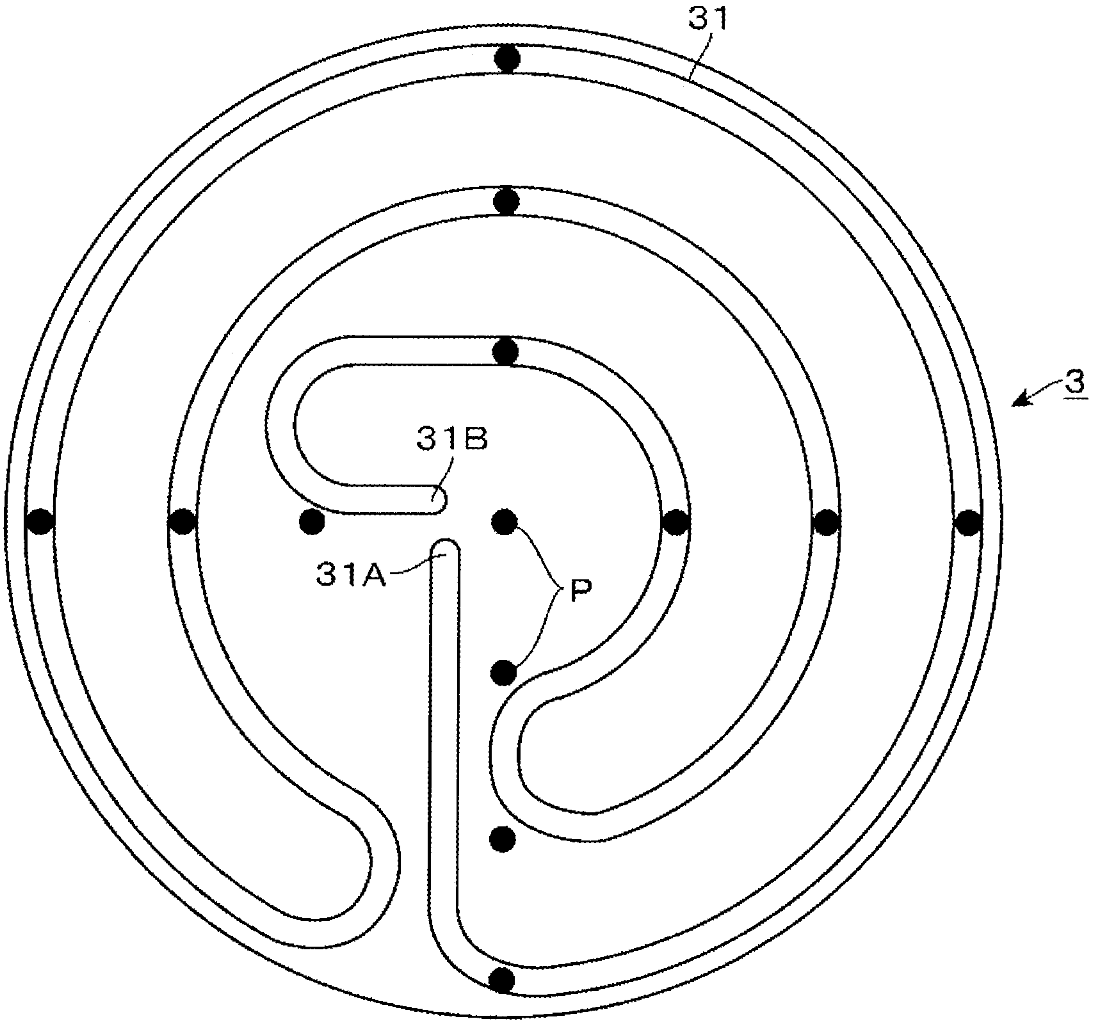
FIG. 10 is a plan view showing temperature measurement points in Example.

For each of Examples 1 to 3 and Comparative Examples 1 and 2, a temperature of each point P on the substrate support main body 20 shown in FIG. 10 was measured. As shown in FIG. 10, these points P are 13 points on vertical and horizontal lines passing through the central portion of the substrate support main body 20.

In Comparative Examples 1 and 2, the maximum temperature difference between the 13 points (points P) was 12.4° C. and 19.5° C., respectively. On the other hand, in Examples 1 to 3, the same temperature difference was 5.2° C. to 8.5° C. Therefore, it may be said that the in-plane temperature uniformity of the substrate support main body 20 may be improved by repeatedly reversing the flow direction of the refrigerant in the refrigerant passage 31. Further, since the temperature difference between the points P is the smallest in Example 3, it may be said that the in-plane temperature uniformity of the substrate support main body 20 may be further improved by using the plurality of heaters 41 and 42 whose outputs are able to be independently adjusted.

Experiment 2

Next, under the same experimental conditions as in Example 1, outputs of the heaters 41 and 42 were detected when a ratio (time 1:time 2) of the time for flowing the refrigerant (time 1) when the first end portion 31A is set to the refrigerant supply position and the time for flowing the refrigerant (time 2) when the second end portion 32A is set to the refrigerant supply position was changed and feedback-controlled.

Each time was set to (time 1:time 2)=(5 seconds:10 seconds), (5 seconds:8 seconds), (3 seconds:10 seconds), (5 seconds:12 seconds), and (3 seconds:12 seconds) and the experiment was conducted.

Figure 11:
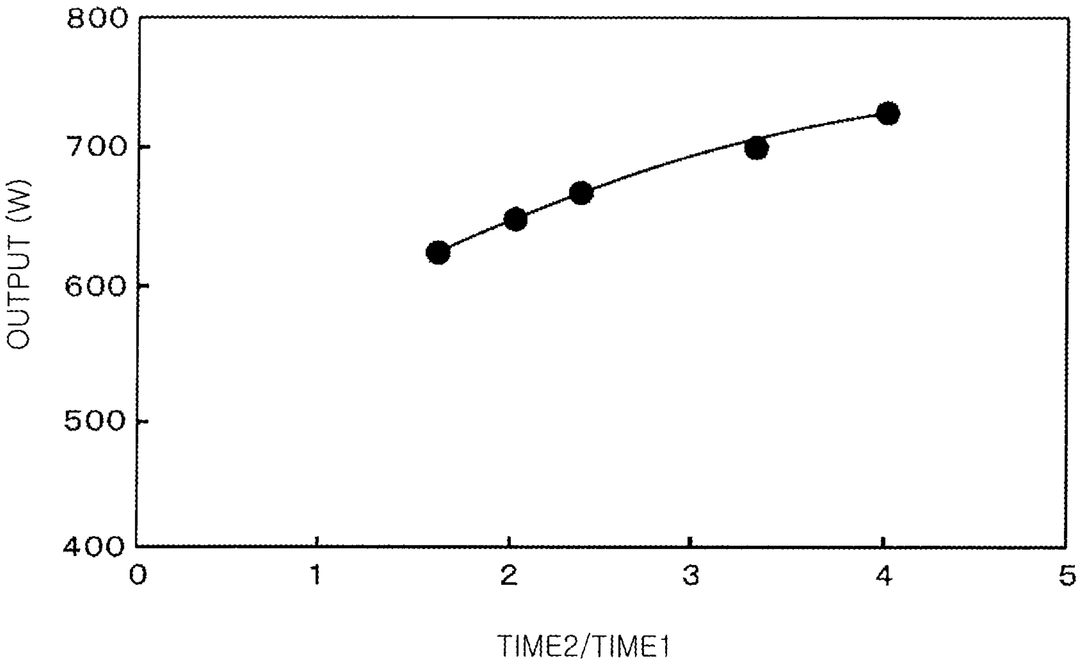
FIG. 11 is a graph showing a relationship between a timing for switching a passage and an output of a heater.

FIG. 11 shows the experimental results described above, and the horizontal axis shows a value of a ratio of time 1 and time 2 (time 2/time 1), and the vertical axis shows a value of a sum of the outputs of the heaters 41 and 42.

As shown in FIG. 11, when a length of time 2 with respect to time 1 is lengthened, it is possible to ascertain a relationship in which the value of the sum of the outputs of the heaters 41 and 42 increases. Therefore, it could be confirmed that even when the temperature of the substrate support main body 20 is adjusted to a set temperature of 300° C., it is possible to change the outputs of the heaters 41 and 42 required to bring the temperature of the substrate support main body 20 close to the set temperature by changing the timing for reversing the flow direction of the refrigerant. Therefore, when the outputs of the heaters 41 and 42 approach the upper limit or the lower limit and there is a small margin for performing temperature control, a margin necessary for temperature control may be secured by adjusting the timing for reversing the flow of the refrigerant.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A substrate support comprising:

a main body of the substrate support that a substrate is placed on and that receives a heat input from at least an outside of the substrate support;

a refrigerant passage provided in the main body and configured to take heat from the main body by a refrigerant;

a plurality of heaters provided in the main body and configured to heat the main body, the plurality of heaters heating different regions of the main body, a valve that switches a position where the refrigerant is supplied to the refrigerant passage and a position where the refrigerant is discharged from the refrigerant passage between one end and another end of the refrigerant passage in order to reverse a direction in which the refrigerant flows in the refrigerant passage;

a power source that independently adjusts an output of each of the plurality of heaters to adjust a heating temperature of the substrate, a thermographic device configured to measure temperatures of a plurality of different positions in a supporting surface of the substrate of the main body or a plurality of different positions on the substrate placed on the supporting surface, the plurality of different positions at which the temperatures are measured by the thermographic device include a position corresponding to the one end of the refrigerant passage and a position corresponding to the other end of the refrigerant passage, a flow controller configured to adjust a flow rate of the refrigerant supplied to the refrigerant passage; and a control unit configured to control the valve to repeatedly reverse the direction in which the refrigerant flows a plurality of times during a period in which the main body receives the heat input to reduce a temperature difference between the position corresponding to the one end of the refrigerant passage and the position corresponding to the other end of the refrigerant passage, and adjust a first duration of time in a first flow direction of the refrigerant with the one end of the refrigerant passage as a refrigerant supply position and a second duration of time in a second flow direction of the refrigerant with the other end of the refrigerant passage as the refrigerant supply position, wherein the control unit is further configured to control a timing for reversing the direction in which the refrigerant flows, the first duration of time or the second duration of time, the output of each of the plurality of heaters and the flow rate of the refrigerant, based on the temperatures of the positions corresponding to the one end and the other end of the refrigerant passage, wherein the period of receiving the heat input from at least the outside of the substrate support includes a period in which the main body is heated by the plurality of heaters, wherein the control unit is further configured to take heat from the main body by allowing the refrigerant to flow through the refrigerant passage, reversing the direction in which the refrigerant flows in the refrigerant passage, and adjusting the first duration of time or the second duration of time while heating the main body by the plurality of heaters provided in the main body.

2. The substrate support of claim 1, wherein the refrigerant is a gas under a temperature and pressure environment in the refrigerant passage during the period of receiving the heat input.

3. The substrate support of claim 1, comprising:

a first system passage connected to the one end of the refrigerant passage;

a second system passage connected to the other end of the refrigerant passage;

a refrigerant supply passage in which the refrigerant supplied to the refrigerant passage flows, connected to the first system passage via a first connection passage, and connected to the second system passage via a second connection passage; and a refrigerant discharge path in which the refrigerant discharged from the refrigerant passage flows, connected to the first system passage via a third connection passage, and connected to the second system passage via a fourth connection passage, wherein the valve is a valve mechanism that switches the position where the refrigerant is supplied and the position where the refrigerant is discharged, by changing an open/closed state of on-off valves respectively provided in the first connection passage, the second connection passage, a third connection passage, and a fourth connection passage.

4. The substrate support of claim 1, wherein the refrigerant passage includes a plurality of circumferential passage portions extending in a circumferential direction of a supporting surface of the substrate in the main body and arranged at intervals from a center side of the supporting surface toward a peripheral portion side of the supporting surface, and connection passage portions extending in a radial direction of the supporting surface and connecting between the plurality of circumferential passage portions disposed adjacent to each other.

5. The substrate support of claim 1, wherein the refrigerant passage has a plurality of radial passages radially extending between a central portion side and a peripheral portion side of a supporting surface of the substrate in the main body.

6. The substrate support of claim 5, wherein when viewing the supporting surface of the substrate in the main body in a plan view, a passage shape of the refrigerant passage is rotationally symmetrically formed around the central portion side of the supporting surface.

7. An apparatus for processing a substrate, comprising:

a substrate support comprising:

a main body of the substrate support that a substrate is placed on and that receives a heat input from at least an outside of the substrate support, a refrigerant passage provided in the main body and configured to take heat from the main body by a refrigerant, a plurality of heaters provided in the main body and configured to heat the main body, the plurality of heaters heating different regions of the main body;

a valve that switches a position where the refrigerant is supplied to the refrigerant passage and a position where the refrigerant is discharged from the refrigerant passage between one end and another end of the refrigerant passage in order to reverse a direction in which the refrigerant flows in the refrigerant passage;

a power source that independently adjusts an output of each of the plurality of heaters to adjust a heating temperature of the substrate, a thermographic device configured to measure temperatures of a plurality of different positions in a supporting surface of the substrate of the main body or a plurality of different positions on the substrate placed on the supporting surface, the plurality of different positions at which the temperatures are measured by the thermographic device include a position corresponding to the one end of the refrigerant passage and a position corresponding to the other end of the refrigerant passage, a flow controller configured to adjust a flow rate of the refrigerant supplied to the refrigerant passage; and a control unit configured to control the valve to repeatedly reverse the direction in which the refrigerant flows a plurality of times during a period in which the main body receives the heat input to reduce a temperature difference between the position corresponding to the one end of the refrigerant passage and the position corresponding to the other end of the refrigerant passage, and adjust a first duration of time in a first flow direction of the refrigerant with the one end of the refrigerant passage as a refrigerant supply position and a second duration of time in a second flow direction of the refrigerant with the other end of the refrigerant passage as the refrigerant supply position, and a processing chamber in which the substrate support is provided and which forms a processing space in which processing of a substrate is performed, wherein the control unit is further configured to control a timing for reversing the direction in which the refrigerant flows, the first duration of time or the second duration of time, the output of each of the plurality of heaters and the flow rate of the refrigerant, based on the temperatures of the positions corresponding to the one end and the other end of the refrigerant passage, wherein the period of receiving the heat input from at least the outside of the substrate support includes a period in which the main body is heated by the plurality of heaters, and wherein the control unit is further configured to take heat from the main body by allowing the refrigerant to flow through the refrigerant passage, reversing the direction in which the refrigerant flows in the refrigerant passage, and adjusting the first duration of time or the second duration of time while heating the main body by the plurality of heaters provided in the main body.

8. The apparatus of claim 7, further comprising:

a gas supply unit configured to supply a processing gas for processing the substrate toward the substrate placed on the substrate support, and another heater configured to heat an inner wall surface of the processing chamber or the gas supply unit, wherein heat supplied from the other heater serves as a heat source of the heat input from the outside.

9. The apparatus of claim 8, further comprising:

a radio frequency (RF) power supply source configured to convert the processing gas into plasma, wherein energy supplied from the plasmatized processing gas serves as a heat source of the heat input from the outside.

* * * * *